(12) United States Patent
Bao et al.

(10) Patent No.: US 10,062,763 B2
(45) Date of Patent: Aug. 28, 2018

(54) METHOD AND APPARATUS FOR SELECTIVELY FORMING NITRIDE CAPS ON METAL GATE

(71) Applicant: QUALCOMM Incorporated, San Diego, CA (US)

(72) Inventors: Junjing Bao, San Diego, CA (US); Haining Yang, San Diego, CA (US); Yanxiang Liu, Glenville, NY (US); Jeffrey Junhao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 14/723,199

(22) Filed: May 27, 2015

(65) Prior Publication Data

US 2016/0351677 A1    Dec. 1, 2016

(51) Int. Cl.
*H01L 29/66* (2006.01)
*H01L 29/40* (2006.01)
(Continued)

(52) U.S. Cl.
CPC ........ *H01L 29/495* (2013.01); *H01L 21/0217* (2013.01); *H01L 21/02164* (2013.01);
(Continued)

(58) Field of Classification Search
CPC .......... H01L 21/02532; H01L 21/2652; H01L 21/823412; H01L 21/22; H01L 21/225; H01L 21/2256; H01L 21/2253; H01L 21/28176; H01L 21/2818; H01L 21/32133; H01L 21/76224; H01L 21/823807; H01L 21/8234; H01L 21/823481; H01L 21/8238; H01L 21/823431; H01L 21/823437; H01L 21/823814; H01L 21/84; H01L 29/0649; H01L 29/0878; H01L 29/66; H01L 29/66636; H01L 29/6659; H01L 29/66795; H01L 29/66477; H01L 29/78618; H01L 21/283–21/2885; H01L 21/76877; H01L 21/76879–21/76883; H01L 21/76897;
(Continued)

(56) References Cited

U.S. PATENT DOCUMENTS 5,936,279 A *   8/1999   Chuang ............. H01L 21/76897
                                                                257/346
6,423,584 B2 *  7/2002   Takahashi ............. 257/E21.682
(Continued)

FOREIGN PATENT DOCUMENTS

WO      2008002947 A1    1/2008

OTHER PUBLICATIONS

International Search Report and Written Opinion—PCT/US2016/033876—ISA/EPO—dated Aug. 29, 2016.

*Primary Examiner* — Natalia Gondarenko
(74) *Attorney, Agent, or Firm* — MG-IP Law, P.C

(57) ABSTRACT

A sacrificial cap is grown on an upper surface of a conductor. A dielectric spacer is against a side of the conductor. An upper dielectric side spacer is formed on a sidewall of the sacrificial cap. The sacrificial cap is selectively etched, leaving a cap recess, and the upper dielectric side spacer facing the cap recess. Silicon nitride is filled in the cap recess, to form a center cap and a protective cap having center cap and the upper dielectric spacer.

21 Claims, 11 Drawing Sheets

(51) Int. Cl.
  *H01L 29/78* (2006.01)
  *H01L 29/06* (2006.01)
  *H01L 21/8234* (2006.01)
  *H01L 29/49* (2006.01)
  *H01L 21/768* (2006.01)
  *H01L 21/02* (2006.01)
  *H01L 21/311* (2006.01)
  *H01L 21/288* (2006.01)
  *H01L 21/3105* (2006.01)
  *H01L 21/3213* (2006.01)
  *H01L 27/088* (2006.01)
  *H01L 29/417* (2006.01)

(52) U.S. Cl.
  CPC ...... *H01L 21/288* (2013.01); *H01L 21/31051* (2013.01); *H01L 21/31111* (2013.01); *H01L 21/32134* (2013.01); *H01L 21/76834* (2013.01); *H01L 21/76897* (2013.01); *H01L 21/823431* (2013.01); *H01L 21/823437* (2013.01); *H01L 21/823475* (2013.01); *H01L 27/0886* (2013.01); *H01L 29/401* (2013.01); *H01L 29/41791* (2013.01); *H01L 29/6656* (2013.01); *H01L 29/785* (2013.01)

(58) Field of Classification Search
  CPC ......... H01L 21/823821; H01L 27/0924; H01L 27/092; H01L 27/0886; H01L 27/12; H01L 23/485; H01L 23/4855; H01L 23/522–23/53295
  USPC .................................. 257/288, 401, 382, 369
  See application file for complete search history.

(56) References Cited

U.S. PATENT DOCUMENTS

| | | | |
|---|---|---|---|
| 8,436,404 | B2 | 5/2013 | Bohr et al. |
| 8,871,582 | B2 | 10/2014 | Pham et al. |
| 9,337,094 | B1* | 5/2016 | Pranartharthiharan ............... H01L 21/76897 |
| 2008/0128763 | A1 | 6/2008 | Rachmady et al. |
| 2011/0108930 | A1* | 5/2011 | Cheng ............ H01L 21/76831 257/412 |
| 2013/0069161 | A1 | 3/2013 | Yang et al. |
| 2013/0277764 | A1 | 10/2013 | Li et al. |
| 2013/0288468 | A1* | 10/2013 | Chi ............... H01L 29/665 438/525 |
| 2013/0309856 | A1 | 11/2013 | Jagannathan et al. |
| 2014/0070285 | A1* | 3/2014 | Xie ................. H01L 29/66545 257/288 |
| 2014/0252424 | A1 | 9/2014 | Cai et al. |
| 2014/0264483 | A1 | 9/2014 | Yoshida et al. |
| 2014/0264487 | A1 | 9/2014 | Pham et al. |
| 2014/0353734 | A1* | 12/2014 | Xie ................. H01L 21/283 257/288 |
| 2015/0035086 | A1* | 2/2015 | Xie ................. H01L 29/66545 257/411 |
| 2015/0235897 | A1 | 8/2015 | Fu et al. |

* cited by examiner

METHOD AND APPARATUS FOR SELECTIVELY FORMING NITRIDE CAPS ON METAL GATE

FIELD OF DISCLOSURE

The present application is generally related to fabrication of semiconductor circuits and, more particularly, to self-aligned etching operations.

BACKGROUND

In the semiconductor arts "self-alignment" is among known techniques for maintaining lateral alignment of a window as it is etched through an upper layer, for example, to a contact pad in an underlying layer. The technique generally utilizes upper layer circuit features already having the desired alignment as a hard mask to perform the etching. Conventional self-alignment techniques include covering certain upper layer features with silicon nitride (hereinafter "nitride") or other hard mask material to protect against etching damage. For example, there are conventional techniques for forming nitride caps over certain metal features to utilize them as self-alignment.

Conventional techniques for forming such protection, though, can have costs. For example, in the fabrication of finned field effect transistors (FinFETs), nitride caps can be formed on in-process adjacent metal gates on a common fin. The nitride capped adjacent fins can then assist in a self-aligning etching of a window for a source/drain contact. However, the nitride cap must have a certain thickness for acceptable protection against shorting of gate metal to source/drain contact. Conventional techniques include etching a recess in the gate metal between the gate spacers, as deep as the desired cap thickness, then filing the deep recess with nitride. This can have costs, including increased gate resistance.

SUMMARY

This Summary identifies some example aspects, and is not an exhaustive description of disclosed subject matter. Whether a feature is included in, or omitted from the Summary is not intended as an indicator of relative importance. Additional features and aspects are described, and will become apparent to persons skilled in the art upon reading the following detailed description and viewing the drawings that form a part thereof.

Various disclosed methods can provide a protective cap on a metal member in a semiconductor circuit and, according to various aspects, operations further to one or more of the disclosed methods can include electroless deposition of a sacrificial member, on an upper surface of the metal member. In an aspect, the sacrificial member can include a sacrificial member sidewall, and the sacrificial member may align with the metal member. In an aspect, example operations in part of one or more methods can include forming an in-process cap spacer, wherein the in-process cap spacer may include a dielectric material, and may be configured to conform to the sacrificial member sidewall. In another aspect, example operations in part of one or more methods can include removing the sacrificial member, leaving a recess, wherein the recess may be defined, at least in part, by the in-process cap spacer and by the upper surface of the metal member. In an aspect, example operations in part of one or more methods can include depositing a nitride fill in the recess to form an in-process nitride cap. In an aspect, the in-process nitride cap may have an in-process cap sidewall. In another aspect, the in-process cap sidewall may conform to the in-process cap spacer. In an aspect, example operations in part of one or more methods can include planarizing the in-process nitride cap and the in-process cap spacer to form the protective cap as a nitride cap and conforming cap spacer.

Examples of self-aligned contacts are disclosed that can extend from an upper level that is above a FinFET fin to an active source/drain region of the FinFET fin, lower level, aligned between a first dielectric spacer that conforms to a sidewall of a first gate metal and a second dielectric spacer that conforms to a sidewall of a second gate metal. Example features according to one or more aspects can include a first protective cap, comprising a first nitride cap and a first cap dielectric spacer. In an aspect, the first nitride cap can be arranged above the first gate metal and may be configured to form a first nitride cap sidewall. In an aspect, the first nitride cap sidewall may be aligned with the sidewall of the first gate metal. In another aspect, the first cap dielectric spacer may be configured to conform to the first nitride cap sidewall. Further example features according to one or more aspects can include forming a second protective cap, which may include a second nitride cap and a second cap dielectric spacer. In one or more aspects, the second nitride cap may be arranged above the second gate metal and can be configured to form a second nitride cap sidewall. In one or more aspects, the second nitride cap sidewall can be aligned with the sidewall of the second gate metal, and the second cap dielectric spacer may be configured to conform to the first nitride cap sidewall. In one or more aspects, features may include a metal contact, which can be configured to fill a recess. In an aspect, the recess may be defined, at least in part, by an upper surface of the lower level contact, a surface of the first dielectric spacer, a surface of the second dielectric spacer, a surface of the first cap dielectric spacer, and a surface of the second cap dielectric spacer.

Various self self-aligned contacts are disclosed, and may extend from an upper level to a lower level contact, aligned between a dielectric spacer on a sidewall of a first metal member and a dielectric spacer on a sidewall of a second metal member. In an aspect, one self self-aligned contact may comprise a first protective cap, which may include a first nitride cap and a first nitride cap dielectric spacer. In an aspect, the first nitride cap may be configured with a first nitride cap sidewall, and the first nitride cap may be supported on an upper surface of the first metal member. The first nitride cap sidewall, in an aspect, may be aligned with the sidewall of the first metal member, and the first nitride cap dielectric spacer may be configured to conform to the first nitride cap sidewall. In an aspect, one self self-aligned contact may further comprise a second protective cap, which may include a second nitride cap and a second nitride cap dielectric spacer. The second nitride cap may be configured with a second nitride cap sidewall, and the second nitride cap sidewall may be configured to conform to the second nitride cap sidewall. In an aspect, the second nitride cap may be supported on an upper surface of the second metal member. In a further aspect, the second nitride cap sidewall may be aligned with the sidewall of the second metal member. In an aspect, one self-aligned contact may include a metal contact, which may be configured as filling a recess, and the recess may be defined, at least in part, by an upper surface of the lower level contact, a surface of the first nitride cap dielectric spacer, a surface of the second nitride cap dielectric spacer, a surface of the dielectric spacer on the sidewall of the first metal member and a surface of the dielectric spacer on the sidewall of the second metal member.

Methods for forming a self-aligned contact to a lower level contact are disclosed, and example operations may include forming, on an upper level of a substrate, a first metal member and a second metal member. In an aspect, the first metal member may have a first metal member top surface and a first sidewall, and the second metal member may have a second metal member top surface and a second sidewall and, conforming to the first sidewall, may be a first dielectric spacer and, conforming to the second sidewall, may be a second dielectric spacer. Example operations can further include, on the first metal member, electroless depositing a first sacrificial member and, on the second metal member, electroless depositing a second sacrificial member. The first sacrificial member may include a first sacrificial member sidewall and, in an aspect, the first sacrificial member sidewall may be aligned with the first sidewall. The second sacrificial member may include a second sacrificial member sidewall and, in an aspect, the second sacrificial member sidewall may be aligned with the second sidewall. Example operations may include forming a first dielectric cap spacer, which can be configured to conform to the first sacrificial member sidewall, and forming a second dielectric cap spacer, which can be configured to conform to the second sacrificial member sidewall. In an aspect, example operations can also include removing the first sacrificial member and leaving, in its place, a first cap recess, and removing the second sacrificial member and leaving, in its place, a second cap recess. Example operations can also include, according to an aspect, forming in the first cap recess a first nitride cap and in the second cap recess a second nitride cap. In a further aspect, the first nitride cap may include a sidewall conforming to the first dielectric cap spacer, and the second nitride cap may include a sidewall conforming to the second dielectric cap spacer. In an aspect, example operations can include self-aligning etching, using the first nitride cap, the first dielectric cap spacer, the second nitride cap, and the second dielectric cap spacer to form a recess to the lower level contact, and filling the recess with a metal.

BRIEF DESCRIPTION OF THE DRAWINGS

The accompanying drawings are presented to aid in the description of aspects, and are provided solely for illustrative examples according to and showing aspects, and are not a limitation thereof.

FIGS. 3A-3J show a sequence, in cross-sectional view from a cut-plane parallel to an extending fin of an in-process FinFET device, of example operations in part of a process including selective forming of silicon nitride caps, and use of same in forming improved self-aligned source/drain contact, in which:

FIG. 3A shows a cross-sectional view of adjacent in-process gates, after recessing and filling with gate metal;

FIG. 3B shows a cross-sectional view after selective growth of a sacrificial member on each of the adjacent gate metals shown formed at FIG. 3A;

FIG. 3C shows a cross-sectional view of an in-process structure, formed by deposition of a conformal spacer over the selectively grown sacrificial members shown formed at FIG. 3B;

FIG. 3D shows a cross-sectional view of a next in-process structure, formed by anisotropically etching the conformal spacer deposited in FIG. 3C, to leave a pair of dielectric walls straddling sidewalls of each the selectively grown sacrificial members shown at FIGS. 3B-3C;

FIG. 3E shows a cross-sectional view of a next in-process structure, formed by conformal dielectric deposition on an upper surface of the in-process structure shown formed at FIG. 3D;

FIG. 3F shows a cross-sectional view of a next in-process structure, having an upper surface formed by chemical mechanical processing on the conformal dielectric deposition shown formed at FIG. 3E;

FIG. 3G shows a cross-sectional view of a next in-process structure, formed by selective etching of the sacrificial members shown remaining at FIG. 3F, leaving a recess above and aligned with each of the adjacent gate metals;

FIG. 3H shows a cross-sectional view of a next in-process structure, formed by a conformal nitride deposition that fills each of the recess shown formed at FIG. 3G, to obtain nitride caps in accordance with one or more aspects;

FIG. 3I shows a cross-sectional view of a next in-process structure, formed by chemical mechanical processing on the conformal nitride deposition shown formed at FIG. 3H; and FIG. 3J shows a cross-sectional view of one example self-aligned source/drain contact, formed utilizing the selectively formed nitride caps in accordance with one or more aspects, shown in FIGS. 3H-3I.

FIG. 4A shows in cross section one example in-process starting structure, having a lower level conductor pad, aligned between a pair of overlaying upper level conductor pads, with spacers;

FIG. 4B shows in cross section one example next in-process structure, formed by electroless growing a sacrificial member on an upper surface of each of the upper level conductor pads of the FIG. 4A;

FIG. 4C shows in cross section one example succeeding in-process structure, from by depositing a conformal spacer of dielectric on an upper surface of the FIG. 4B;

FIG. 4D shows in cross section, one example next in-process structure, formed by anisotropically etching the conformal spacer deposited in FIG. 4C, to leave a pair of dielectric walls against sidewalls of each the selectively grown sacrificial members shown at FIG. 4C;

FIG. 4E shows in cross section one example next succeeding in-process structure, formed by depositing a dielectric layer over an upper surface of the one example succeeding in-process structure shown at FIG. 4D;

FIG. 4F shows in cross section one example next in-process structure, formed by applying a chemical mechanical processing on the next succeeding in-process structure shown at FIG. 4E;

FIG. 4G shows in cross section one example next in-process structure, formed by selective etching of the sacrificial members shown remaining at FIG. 4F, leaving a recess above and aligned with the respective top surfaces of the upper layer conductors;

FIG. 4H shows in cross section one example succeeding in-process structure, formed by a nitride deposition that fills each of the recess shown formed at FIG. 4G;

FIG. 4I show in cross section one example next in-process structure, formed by applying a chemical mechanical processing on the conformal nitride deposition shown formed at FIG. 4H; and FIG. 4J shows a cross-sectional view of another example self-aligned source/drain contact, formed utilizing the selectively formed silicon nitride caps in accordance with one or more aspects, as shown in FIGS. 4H-4I.

DETAILED DESCRIPTION

Aspects are disclosed in the following description and related drawings. Various alterations that do not depart from the scope of the disclosed aspects may become apparent upon reading this disclosure. Additionally, in description of certain example applications, implementations and operations related to same, instances are identified, explicitly or implicitly from the described context, where known conventional techniques may be employed for certain components and acts. In such instances, detailed description of the employed conventional techniques may be omitted so as not to obscure relevant details of the invention.

The word "exemplary" is used herein to mean "serving as an example, instance, or illustration." Any aspect or example configuration of same that described herein as "exemplary" is not necessarily to be construed as preferred or advantageous over other aspects or configurations. Likewise, discussion of a feature, advantage or mode of operation in relation to the term "aspects of the invention" does not imply that all aspects of the invention include the discussed feature, advantage or mode of operation.

The terminology used herein is for the purpose of describing particular aspects only and is not intended to be limiting of the invention. As used herein, the singular forms "a," "an," and "the" are intended to include the plural forms as well, unless the context clearly indicates otherwise. In addition, the terms "comprises," "comprising," "includes" and/or "including," as used herein, specify the presence of stated features, integers, steps, operations, elements, and/or components, but do not preclude the presence or addition of one or more other features, integers, steps, operations, elements, components, and/or groups thereof.

Further, certain aspects are described in terms of example operations. It will be understood that except where otherwise described such operations can be performed by specific circuits (e.g., application specific integrated circuits (ASICs)), by program instructions being executed by one or more processors, or by a combination of both. In addition, specific circuits (e.g., ASICs), processors and program instructions executed by one or more of the same may be described as "logic configured to" perform described operations and action(s). Additionally, sequences of actions described herein can be considered to be embodied entirely within any form of computer readable storage medium.

Figure 1:
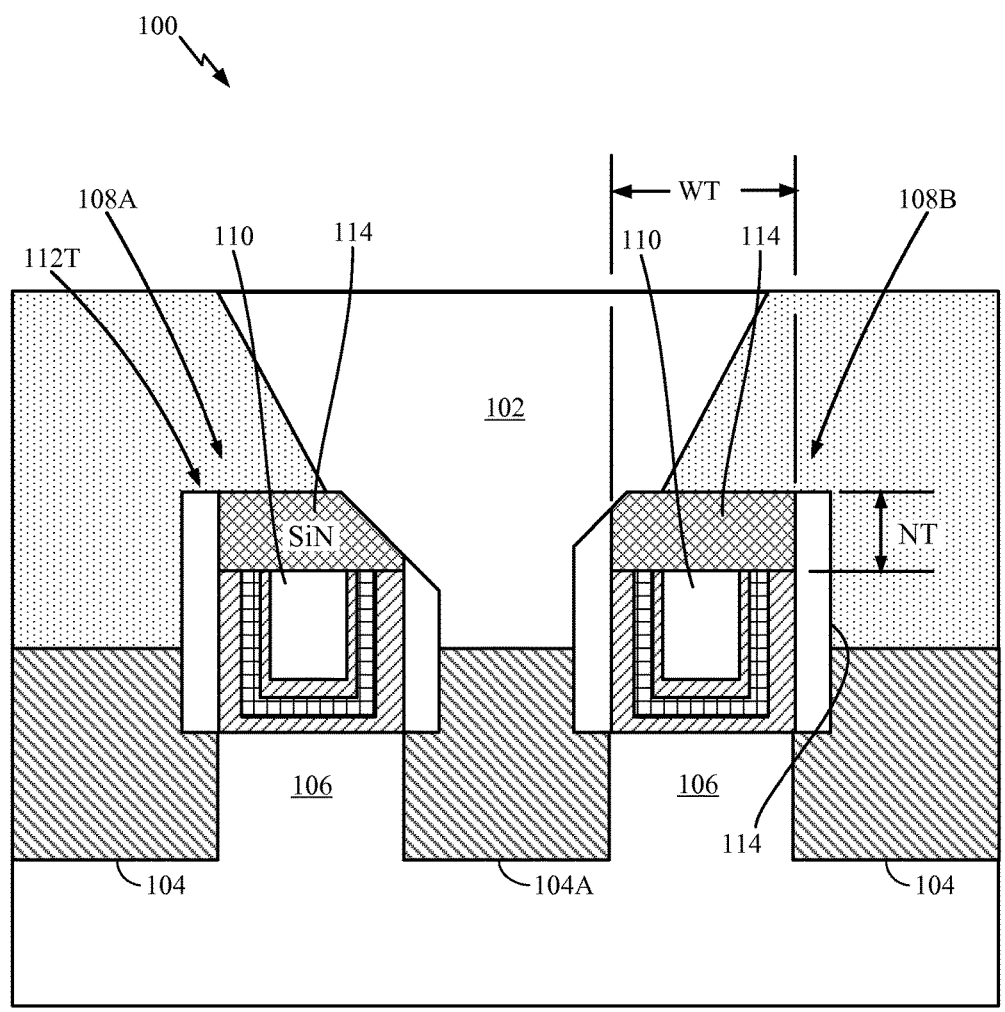
FIG. 1 shows a cross-sectional view of one example conventional self-aligned source/drain contact.

FIG. 1 shows a cross-sectional view of a conventional FinFET structure 100 having a conventionally formed self-aligned source/drain contact 102 (hereinafter "conventional self-aligned SD contact" 102). The conventional self-aligned SD contact 102 extends to one active source/drain region 104A (hereinafter "active SD region" 104A) of a fin 106. The active SD region 104A contacted by the conventional self-aligned SD contact 102 may be one among a plurality of active SD regions 104. Gate 108A and gate 108B straddle respective channel regions (not visible in FIG. 1) of the fin 106. Gate 108A and gate 108B can each include a gate metal 110, and can each include, for example, a high-K layer, a barrier layer and a work-function layer (visible in FIG. 1 but not separately numbered). To avoid description of details not specific to concepts, the high-K layer, barrier layer and work-function layer are collectively referenced hereinafter as "other gate layers." The gate 108A and gate 108B will collectively be referenced hereinafter as the "gates 108" (a reference number that does not explicitly appear in FIG. 1).

Referring to FIG. 1, the gate metal 110 and other gate layers can be configured between gate spacers 112 (only one is explicitly numbered). Processes for forming the conventional FinFET structure 100 are known to persons of skill in the art. Therefore, detailed description is not necessary for such persons to understand concepts of this disclosure. Portions, however, will be described for purposes of background. For example, persons of ordinary skill will understand that in conventional techniques for forming conventional self-aligned SD contact 102 there can be a stage (not visible in FIG. 1), prior to a conventional etch and metal fill that formed the conventional self-aligned SD contact 102, at which the gate metal 110 and other gate layers extended upward to the top 112T of the gate spacers 112. Subsequent conventional operations can then etch a gate recess (visible but filled in FIG. 1) into the gate metal 110 and other gate layers. The recess can be to a depth NT. The etching can be followed by a filling of the gate recess with nitride to form the caps 114. The caps 114 can have a thickness equal to NT, i.e., the same as the depth NT of the etched recess. Etching the recess to the depth NT, though, removed significant quantity of metal from a larger metal body (not explicitly visible in FIG. 1) of which the gate metal 110 is a remainder. The etching can result in the gate metal 110 being thinner than a thickness that existed prior to the etching. The thinning may have significantly increased the electrical resistance of the gate metal 110 over the resistance that would be exhibited without the etching.

Conventional nitride cap techniques can also limit the width of the nitride caps to the spacing WT between the inner faces (visible in FIG. 1 but not separately labeled) of the gate spacers 112. Such limitation of the width WT increases the height-to-width aspect ratio of the gates 108. The increase in the height-to-width aspect ratio, in turn, can create difficulty in controlling quality of the conventional self-aligned SD contact 102.

Figure 2:
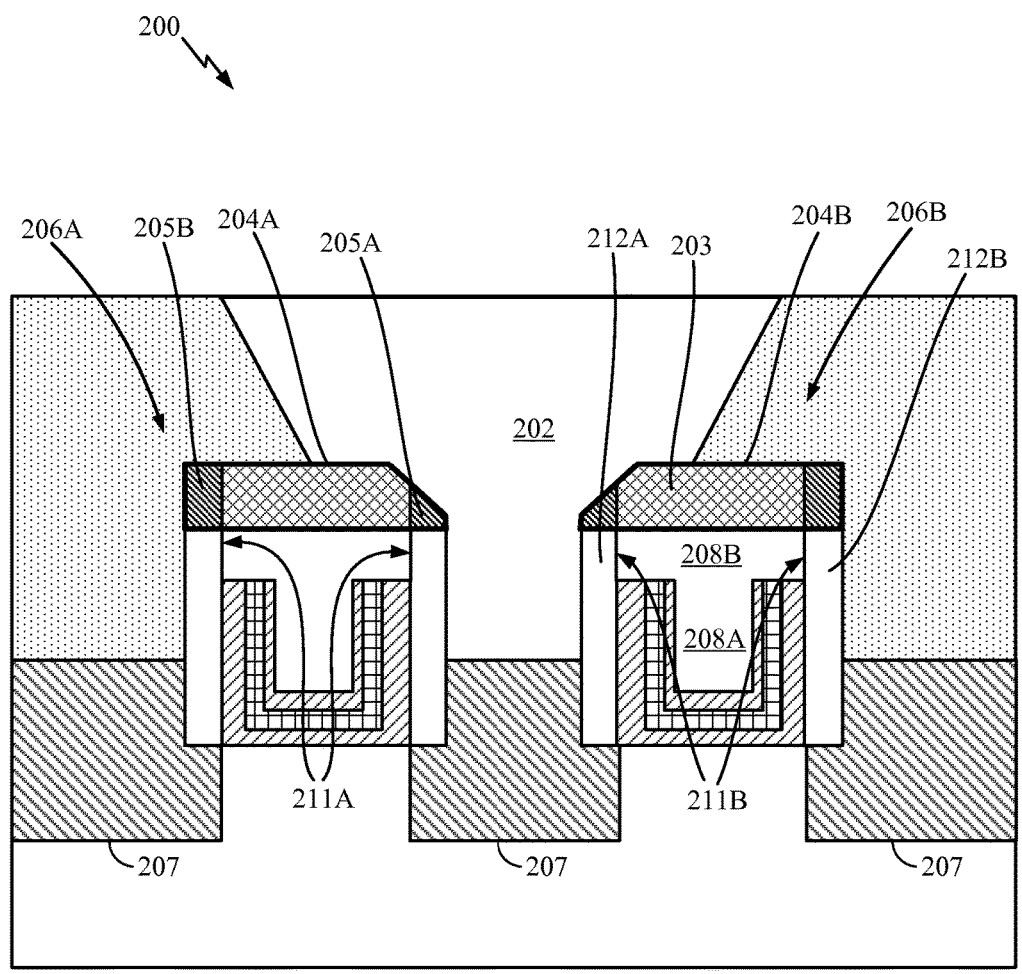
FIG. 2 shows a cross-sectional view of one example self-aligned source/drain contact formed using selectively placed silicon nitride caps, according to one or more aspects.

FIG. 2 shows a cross-sectional view of a FinFET device 200, which can be arranged having a self-aligned SD contact 202, formed using a selectively placed first silicon nitride protective cap 204A and a selectively placed second silicon nitride protective cap 204B, in accordance with disclosed concepts. The selectively placed first silicon nitride protective cap 204A and the selectively placed second silicon nitride protective cap 204B will alternatively referenced, collectively, as "selectively placed protective caps 204." It will be understood that selectively placed protective caps, such as the selectively placed protective caps 204, and formation of self-aligned contacts, such as the self-aligned SD contact 202, using same, are not limited to FinFET devices. Selectively placed protective caps according to one or more aspects may be formed and used, for example, to form self-aligned SD contacts in a planar FET. In addition, self-aligned contacts formed using selectively placed protective caps according to disclosed aspects are not limited to silicon/drain contacts. On the contrary, selectively placed protective caps according to disclosed aspect may be used to form self-aligned contacts, e.g., from an upper level metallization to a lower level contact, in various other applications.

Referring to FIG. 2, the FinFET device 200 can include a first gate 206A and a second gate 206B, which can be adjacent to one another. First gate 206A and second gate 206B are alternatively referenced, collectively, as "gates 206," (a reference number not explicitly shown in FIG. 2). To avoid overly dense graphics, structures appearing in both of the gates 206 may be labeled only in the first gate 206A or only in the second gate 206B. Each of the gates 206 can be configured to straddle a channel region (obstructed from viewed by the gates 206) of a fin 207. Each of the gates 206 can be configured to include a gate metal 208 and other gate layers 209, particularly configured between inner walls (visible but not separately numbered) of a first spacer 212A and a second spacer 212B. The first spacer 212A and the second spacer 212B are alternatively referenced hereinafter, interchangeably, as "spacers 212" and "pair of spacers 212." In an aspect, the gate metal 208 may be, or may comprise tungsten (W), and the spacers 212 can be formed of a low K dielectric, for example, but not limited to SiBCN (silicon, boron, carbon, nitrogen).

Continuing to refer to FIG. 2, in an aspect, the gate metal 208 can be formed with a T-shaped cross section, comprising a gate metal base 208A and a gate metal upper region 208B. The gate metal base 208A can have a form comparable to the gate metal 110 of the conventional FinFET structure 100. The gate metal upper region 208B can fill a recess (visible in outline but filled and not separately numbered) extending between the inner walls of the pair of spacers 212. It will be appreciated that a comparable recess in the FIG. 1 conventional FinFET structure 100 is filled with nitride. The gate metal upper region 208B of the first gate 206A can form a pair of first gate metal sidewalls 211A, which may face against respective inner faces (visible in FIG. 2 but not separately labeled) of the pair of spacers 212 of the first gate 206A. The gate metal upper region 208B of the second gate 206B can form a pair of second gate metal sidewalls 211B, which may face against respective inner faces (visible in FIG. 2 but not separately labeled) of the pair of spacers 212 of the second gate 206B.

Referring to FIG. 2, in each of the first gate 206A and second gate 206B, the gate metal upper region 208B can have an upper surface (visible in FIG. 2 but not separately numbered), and the pair of spacers 212 that surround that gate metal upper region 208B can have an upper surface (visible in FIG. 2 but not separately numbered), all of which may be in a common plane. On an upper surface (visible in FIG. 2 but not separately numbered) of the gate metal upper region 208B and pair of spacers 212 of the first gate 206A is the first selectively placed protective cap 204A. On an upper surface (visible in FIG. 2 but not separately numbered) of the gate metal upper region 208B and pair of spacers 212 of the second gate 206B is the second selectively placed protective cap 204B. The first selectively placed protective cap 204A and the second selectively placed protective cap 204B will be alternatively referred to, collectively, as "selectively placed protective caps 204."

Continuing to refer to FIG. 2, in an aspect, each of the selectively placed protective caps 204 comprise a nitride cap 203, a nitride cap first spacer 205A and a nitride cap second spacer 205B. For reasons that are later described in greater detail, the nitride cap 203 can be closely aligned with the top surface of the underlying gate metal upper region 208B. The nitride cap first spacer 205A and the nitride cap second spacer 205B, each arranged against a respective sidewall or the nitride cap 203, can provide the selectively placed protective caps 204 with a width greater than the width of the underlying gate metal upper region 208B. As will be understood by persons of ordinary skill upon reading this disclosure, features and advantages provided by these and other aspects can include the gates 206 having a height-to-width aspect ratio substantially lower than the height-to-width aspect ratio of the gates 108 of the FIG. 1 conventional FinFET structure 100.

FIGS. 3A-3J show a sequence, in cross-sectional view from a cut-plane parallel to an extending fin of an in-process FinFET device, of example operations in part of a process including selective forming of silicon nitride caps, and corresponding self-aligned source/drain contacts in accordance with various aspect.

Figure 3A:
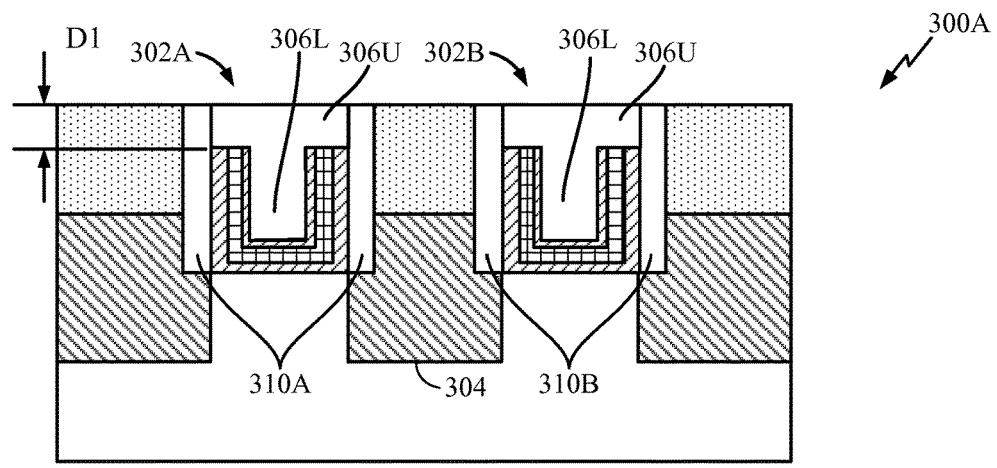

FIG. 3A shows a cross-sectional view of an in-process structure 300A, comprising in-process first gate 302A, straddling a fin 304 and, adjacent the in-process first gate 302A, in-process second gate 302B, also straddling the fin 304

The in-process first gate 302A can include a first gate metal 306A, and the in-process second gate 302B can include a second gate metal 306B. The first gate metal 306A and the second gate metal 306B are alternatively referenced, collectively, as "gate metals 306," (a reference number not explicitly shown in FIG. 3). To avoid confusingly dense graphics, structures appearing in both of the gate metals 306 may be labeled only in the first gate metal 306A or only in the second gate metal 306B.

The gate metals 306 can each be formed by etching depth D1 into a conventionally formed configuration of gate layers (visible but not separately numbered) between a corresponding pair of gate spacers, for example, the pair of first gate spacers 310A and the pair of second gate spacers 310B, and filling the resulting recess with gate metal. The pair of first gate spacers 310A and the pair of second gate spacers 310B are alternatively referenced, collectively, as "pair of gate spacers 310" (a reference number not explicitly shown in FIG. 3). Each pair of gate spacers 310 can be formed of a low K dielectric, for example, but not limited to SiBCN. The gate metals 306 can be formed with a "T"-shaped cross section, comprising a gate metal base 306L and a gate metal top region 306U. Portions (visible in FIG. 3A but not separately labeled) of the gate metal top region 306U that extend beyond the gate metal base 306L can have a thickness D1 equal to the etching depth D1.

Figure 3B:
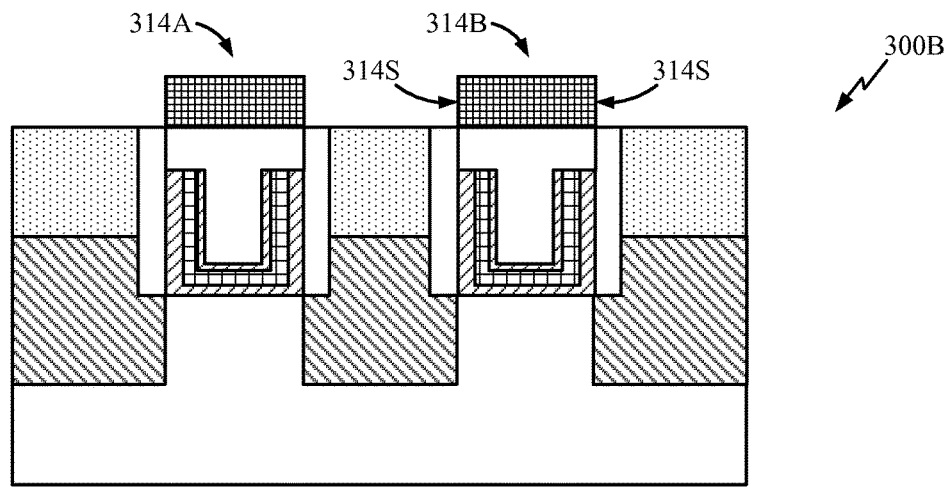

FIG. 3B shows a cross-sectional view of a next in-process structure 300B, which can be formed by electroless plating of a first sacrificial member 314A on an upper surface (visible, but not separately numbered) of the first gate metal 306A, and of a second sacrificial member 314B on an upper surface (visible, but not separately numbered) of the second gate metal 306B. The first sacrificial member 314A and the second sacrificial member 314B will be alternatively referenced, collectively, as "the sacrificial members 314" (a reference number not explicitly shown in the figures).

In an aspect, if the gate metals 306 comprise W, the sacrificial members 314 can comprise cobalt (Co), or cobalt/tungsten/phosphorous (CoWP), or both. In another aspect, the sacrificial members 314 may consist of CoWP. In another aspect, the sacrificial members 314 may consist of Co.

Referring to FIG. 3B, in an aspect, the pair of first gate spacers 310A and the pair of second gate spacers 310B each have a pair of mutually facing surfaces (visible in FIG. 3B but not separately numbered). In an aspect, the gate metal top region 306U of the gate metals 306 each extend between and up to the pair of mutually facing surfaces. In other words, each of the gate metals 306 has a pair of gate metal sidewalls (visible in FIG. 3B but not separately numbered), and the pair of gate metal sidewalls are arranged against the pair of mutually facing surfaces. In another aspect, growing the sacrificial members 314 as described above can form each of the sacrificial members 314 to have a pair of sacrificial member sidewalls 314S. In an aspect, the described electroless growing of each of the sacrificial members 314 can automatically position its pair of sacrificial member sidewalls 314S to be aligned with its corresponding pair of mutually facing surfaces of the pair of gate spacers 310.

Figure 3C:
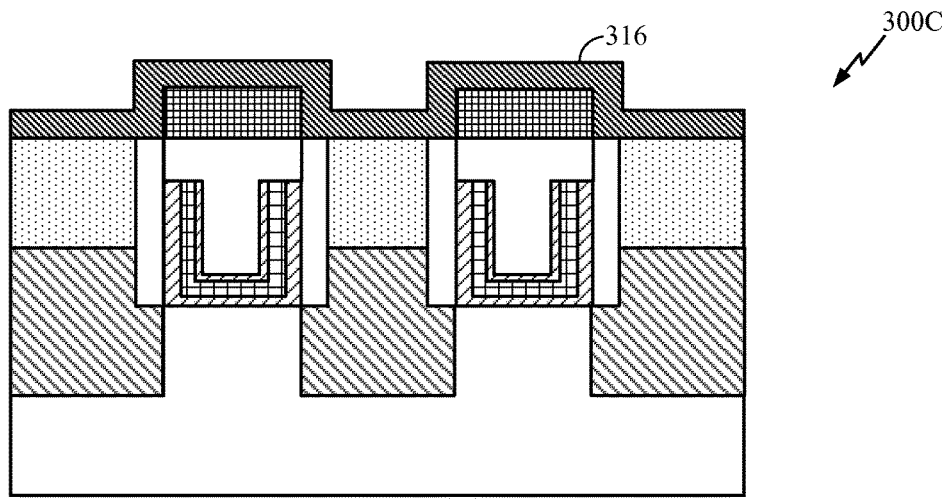

FIG. 3C shows a cross-sectional view of an in-process structure 300C, which can be formed by deposition of a conformal spacer 316 over the selectively grown sacrificial members 314 shown formed at FIG. 3B. The conformal spacer 316 can comprise, for example $Si_xN_y$, or $SiO_2$, or both.

Figure 3D:
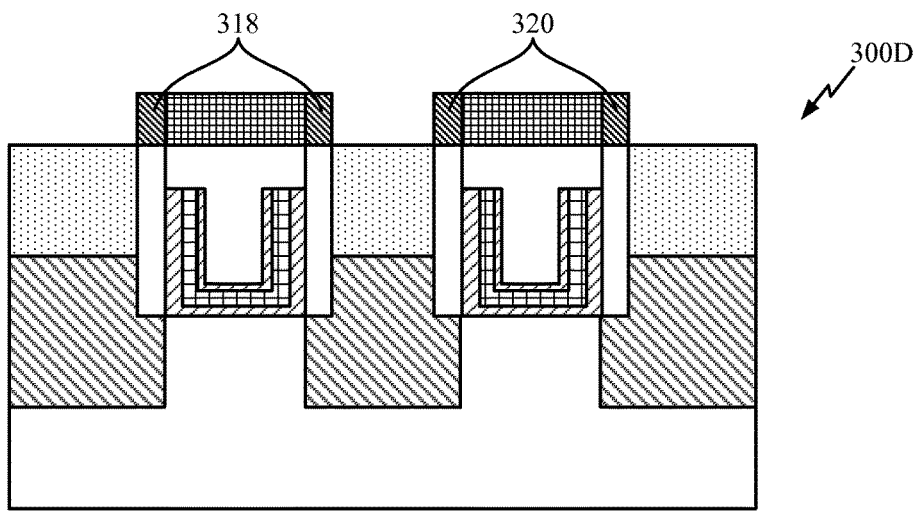

FIG. 3D shows a cross-sectional view of a next in-process structure 300D, which can be formed by anisotropically etching the conformal spacer 316 deposited in FIG. 3C, to leave remaining portions. One remaining portion can form an in-process first pair of dielectric spacers 318, and another remaining portion can form an in-process second pair of dielectric spacers 320. In an aspect, the in-process first pair of dielectric spacers 318 may straddle the 314S sidewalls of the first sacrificial member 314A shown at FIGS. 3B-3C. In a similar aspect, the in-process second pair of dielectric spacers 320 may straddle the 324S sidewalls of the second sacrificial member 314B.

Referring to FIG. 3D, in an aspect, if the thickness of the conformal spacer 316 is selected as approximately the thickness of the gate spacers 310, anisotropically etching the conformal spacer 316 can form each pair of in-process dielectric spacers (e.g., the in-process first pair of dielectric spacers 318 and the in-process second pair of dielectric spacers 320) to be aligned with and supported by an upper surface (visible in part in FIG. 3D, but not separately numbered) of a corresponding one of the pair of gate spacers 310. As specific examples, the in-process first pair of dielectric spacers 318 is aligned with and supported by an upper surface (visible in FIG. 3D, but not separately numbered) of the gate spacers 310 of the first gate metal 306A. The in-process second pair of dielectric spacers 320 is aligned with and supported by an upper surface (visible in part in FIG. 3D, but not separately numbered) of a corresponding one of the pair of second gate spacers 310B.

Figure 3E:
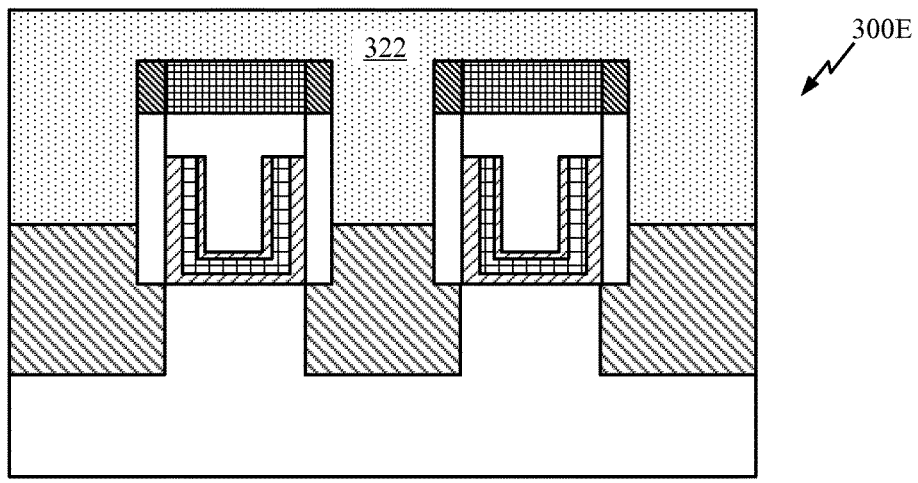

FIG. 3E shows a cross-sectional view of a next in-process structure 300E, formed by conformal dielectric deposition of a dielectric 322, e.g., $SiO_2$ on an upper surface (visible but not separately labeled of the in-process structure shown formed at FIG. 3D. Among reasons for the conformal dielectric deposition of the dielectric 322 is to form a sufficient thickness of material such that a planarizing operation will not damage or destroy operable circuitry.

Figure 3F:
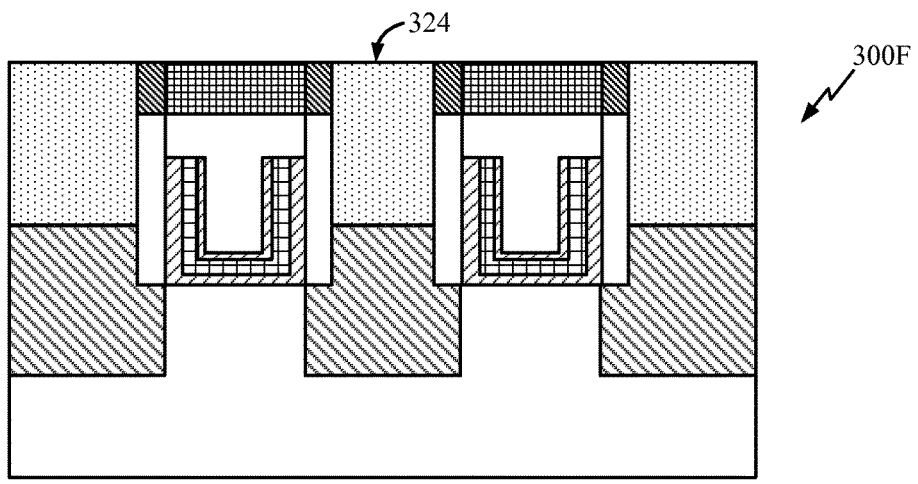
Figure 3G:
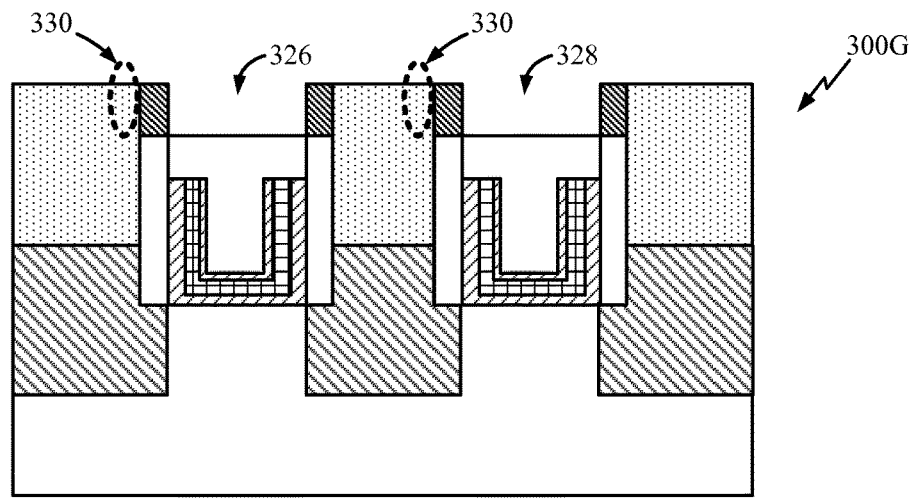

FIG. 3F shows a cross-sectional view of a next in-process structure 300F, having an upper surface 324 formed, for example, by chemical mechanical planarization on the conformal dielectric deposition shown formed at FIG. 3E;

FIG. 3G shows a cross-sectional view of a next in-process structure 300G, formed by selective etching of the sacrificial members 314 shown remaining at FIG. 3F. The selective etching leaves a first recess 326 above a top surface of the first gate metal 304A, and a second recess 328 above a top surface of the second gate metal 304B. In one aspect, the first recess 326 is defined, at least in part, by the in-process first pair of dielectric spacers 318 and by the upper surface of the first gate metal 304A. The second recess 328 is defined, at least in part, by the in-process first pair of dielectric spacers 318, and by the upper surface of the first gate metal 304A.

As described above, the sacrificial members 314 may be formed, for example, of CoWP, or Co, or both. In an implementation that forms the sacrificial members 314 of one of these example materials, the selective etching can use an etching fluid, for example, H2O:HNO3(1:1), HCL:H2O2 (3:1).

As illustrated at FIG. 3G, the combination of the dielectric 322 at FIG. 3E and the chemical mechanical planarization at FIG. 3F, provides regions of lateral support 330 for the in-process first pair of dielectric spacers 318 and the in-process second pair of dielectric spacers 320. Additional support may be provided by the forming the in-process dielectric spacers 318/320 on top or upper surfaces of the gate spacers 310, as described above.

Figure 3H:
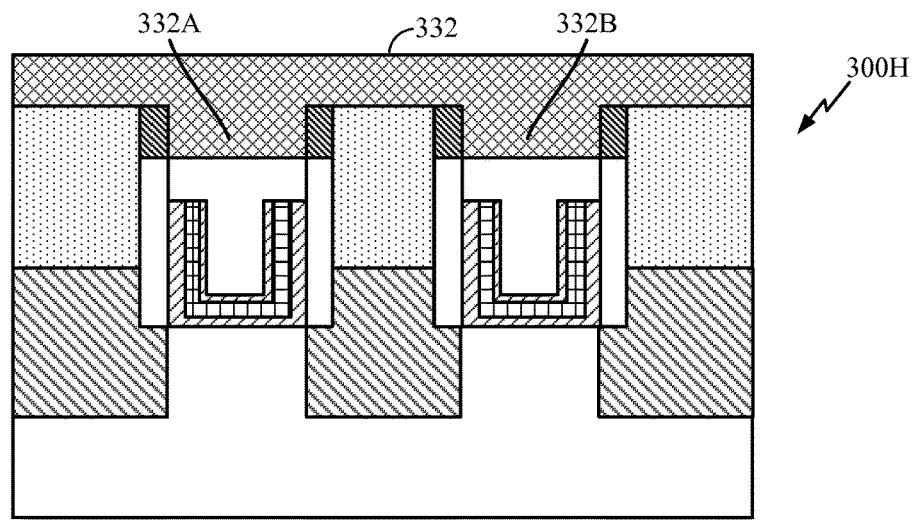
Figure 3I:
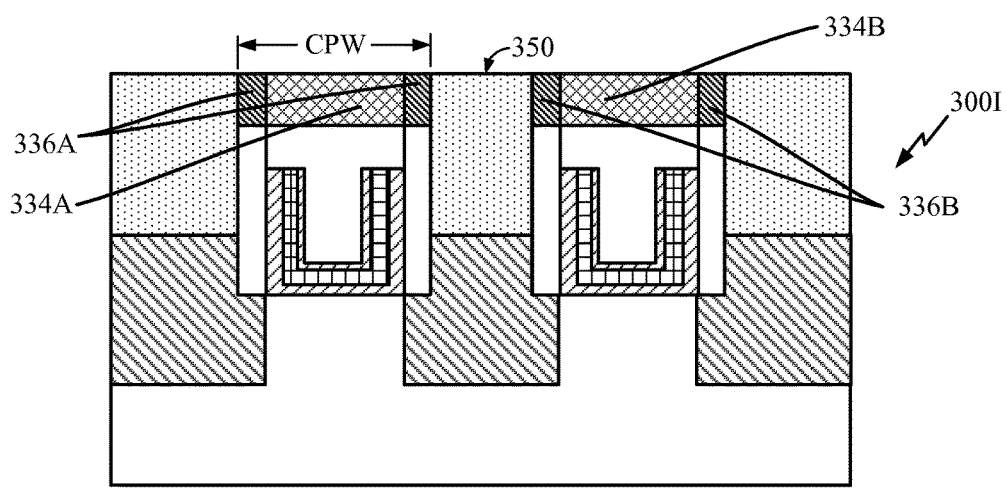
Figure 3J:
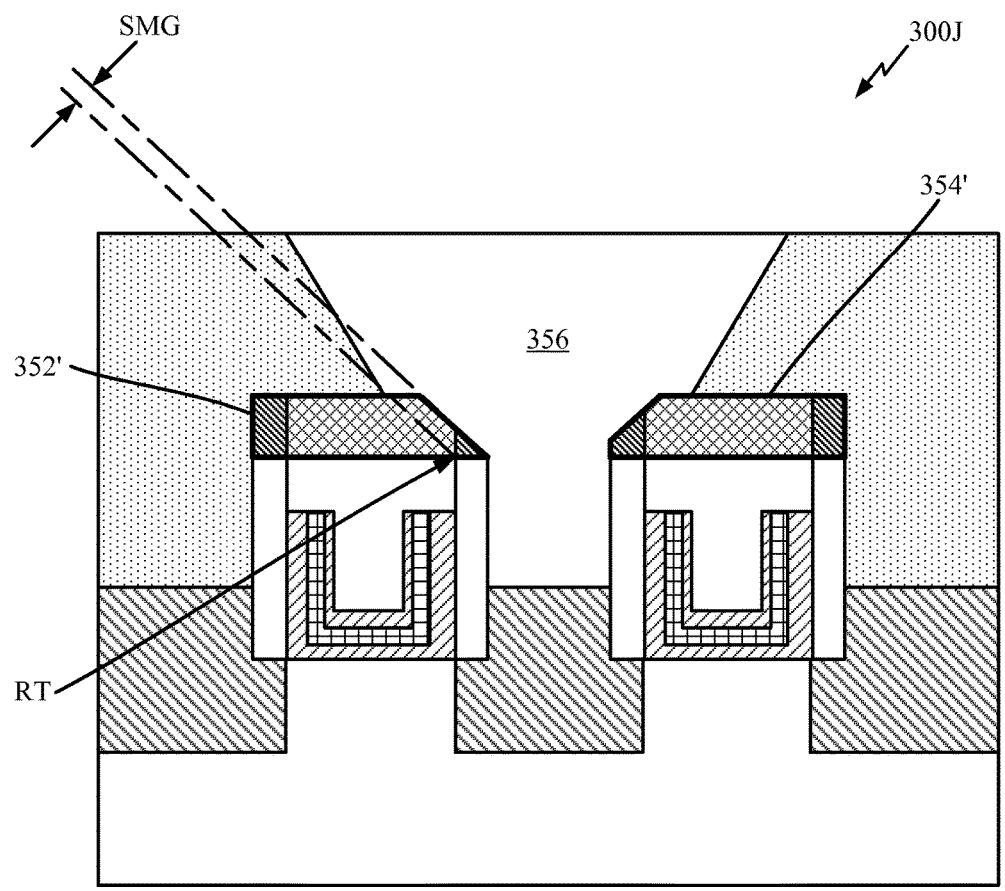

FIG. 3H shows a cross-sectional view of a next in-process structure 300H, formed by a conformal nitride deposition 332 that fills each of the first recess 326 and the second recess 328 (not labeled as such in FIG. 3G) shown formed at FIG. 3G. Referring to FIG. 3H, the conformal nitride deposition 332 can form or include a first dielectric fill 332A that occupies the first recess 326, and a second dielectric fill 332B that occupies the second recess 328. As will be understood from the following description in reference to FIG. 3I, the first dielectric fill 332A can be described as in-process first nitride cap and the second dielectric fill 332B can be described as an in-process second nitride cap. The FIG. 3I shows a cross-sectional view of a next in-process structure 300I, formed by chemical mechanical planarization on the conformal nitride deposition shown formed at FIG. 3H, to form an upper surface 350. Referring to FIG. 3J, a remaining portion of the conformal nitride deposition 332, which was the first dielectric fill 332A or in-process first nitride cap, is now a first nitride cap 334A. Similarly, another remaining portion of the conformal nitride deposition 332, which was the second dielectric fill 332B or in-process second nitride cap, is now a second nitride cap 334B.

Arranged on the sidewalls (visible in FIG. 3I but not separately labeled) of the first nitride cap 334A are a first pair of dielectric spacers 336A, formed of portions of the in-process first pair of dielectric spacers 318 that remain after the planarization. Arranged on the sidewalls of the second nitride cap 334B are a second pair of dielectric spacers 336B, formed of portions of the in-process second pair of dielectric spacers 320 that remain after the planarization. The combination of the first nitride cap 334A and the first pair of dielectric spacers 336A can form a first protective cap 352. The combination of the second nitride cap 334B and the second pair of dielectric spacers 336B can form a second protective cap 354. As can be seen in FIG. 3I, the first protective cap 352 and the second protective cap 354 are aligned with the gate metals 306. The alignment is provided by the electroless plating operations that formed the sacrificial members 314 to which the first nitride cap 334A and the second nitride cap 334B correspond. In addition to the alignment, the first pair of dielectric spacers 336A and the second pair of dielectric spacers 336B that remain on the sidewalls of the first nitride cap 334A and the second nitride cap 334B, respectively, can provide both the first protective cap 352 and the second protective cap 354 with a protective cap diameter CPW that is wider than the gate metals 306.

FIG. 3J shows a cross-sectional view of a final in-process structure 300J, representing a self-aligned etching of a window to a source/drain top surface (visible but not separately numbered) of the fin 304, and filling the window with contact metal to form a contact 356. Referring to FIGS. 3I and 3J, the represented self-aligned etching that formed the above-described window can etch away a portion of the first protective cap 352 and a portion of the second protective cap 354. A remaining portion of the first protective cap 352 is represented in FIG. 3J as a remaining first protective cap 352'. Similarly, a remaining portion of the second protective cap 354 is represented in FIG. 3J as a remaining second protective cap 354'.

Continuing to refer to FIG. 3J, the contact 356 is illustrated to represent an asymmetry that can occur in etching the window. A representative result of the asymmetry is the upper right portion (visible in FIG. 3J but not separately labeled) of the first protective cap removed to leave the remaining first protective cap 352' being visibly greater than the upper left portion (visible in FIG. 3J but not separately labeled) of the second protective cap 354 removed to leave the remaining second protective cap 354'. However, even with such asymmetry in the etching, the remaining first protective cap 352' provides safety margin SMG of dielectric between the upper right edge "RT" of the first gate metal 306A and the contact 356. As can be appreciated by persons of ordinary skill upon reading this disclosure, because of the above-described protective cap width CPW that can be obtained with protective caps according to disclosed aspects, the gate metal top region 306U can be included and, at the same time, the upper safety margin SMG can be sufficient.

FIGS. 4A-4J show a sequence, viewed in cross-section on a fixed cut-plane that is normal to a supporting substrate, of example operations in part of a process for forming a self-aligned contact using including selective forming of nitride caps, according to various aspects.

Figure 4A:
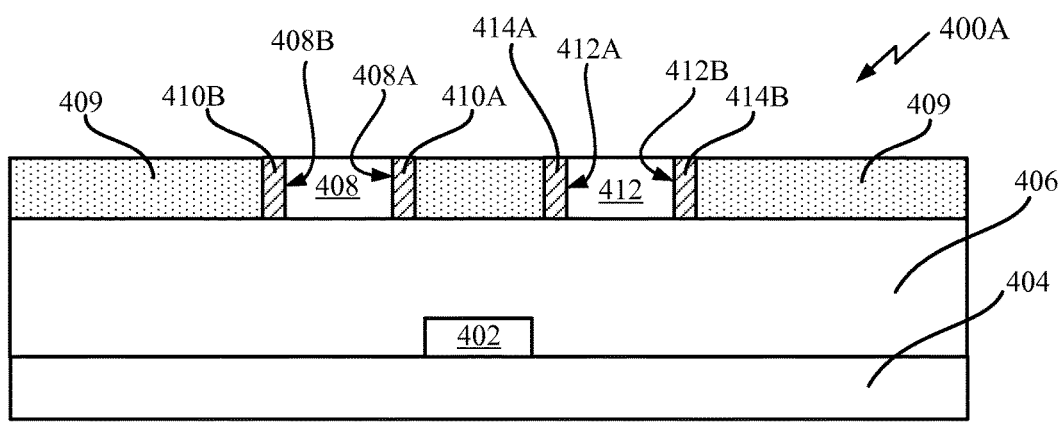
FIGS. 4A-4J show a sequence, viewed in cross-section on a fixed cut-plane that is normal to a supporting substrate, of example operations in part of a method for forming a self-aligned contact using including selective forming of nitride caps, according to various aspects.

FIG. 4A shows, in cross section, in-process starting structure 400A. Referring to FIG. 4A, the in-process starting structure 400A may include a lower level conductor 402, for example, a conventional metallization, that is formed on a substrate 404. A dielectric layer 406, for example silicon dioxide (SiO2), may overlay the lower level conductor 402 and an adjacent area (visible in FIG. 4A, but not separately numbered) of the substrate 404. Additional operations (not visible in FIG. 4A) can include forming, on an upper surface (visible in FIG. 4A but not separately labeled) of the dielectric layer 406 a first metal member 408 having a first metal member first sidewall 408A and, conforming to the first metal member first sidewall 408A, a first metal member first dielectric spacer 410A.

In an aspect, the first metal member 408 may also have a first metal member second sidewall 408B and, conforming to the first metal member second sidewall 408B, a first metal member second dielectric spacer 410B. The first metal member first sidewall 408A and the first metal member second sidewall 408B may be referenced as a "first metal member pair of sidewalls." The first metal member first dielectric spacer 410A and the first metal member second dielectric spacer 410B may be referenced as a first metal member pair of dielectric spacers 410 (a reference number not separately visible in the figures).

Referring to FIG. 4A, in an aspect, operations may include forming on the upper surface of the dielectric layer 406 a second metal member 412. The second metal member 412 may have a second metal member first sidewall 412A and, conforming to the second metal member first sidewall 412A, a second metal member first dielectric spacer 414A. In an aspect, the second metal member 412 may also have a second metal member second sidewall 412B and, conforming to the second metal member second sidewall 412B, a second metal member second dielectric spacer 414B. The second metal member first sidewall 412A and the second metal member second sidewall 412B may be referenced as a "second metal member pair of sidewalls." The second metal member first dielectric spacer 414A and the second metal member second dielectric spacer 414B may be referenced as a second metal member pair of dielectric spacers 414 (a reference number not separately visible in the figures). A fill dielectric 409 may fill the interstices on the top surface of the dielectric layer 406.

Figure 4B:
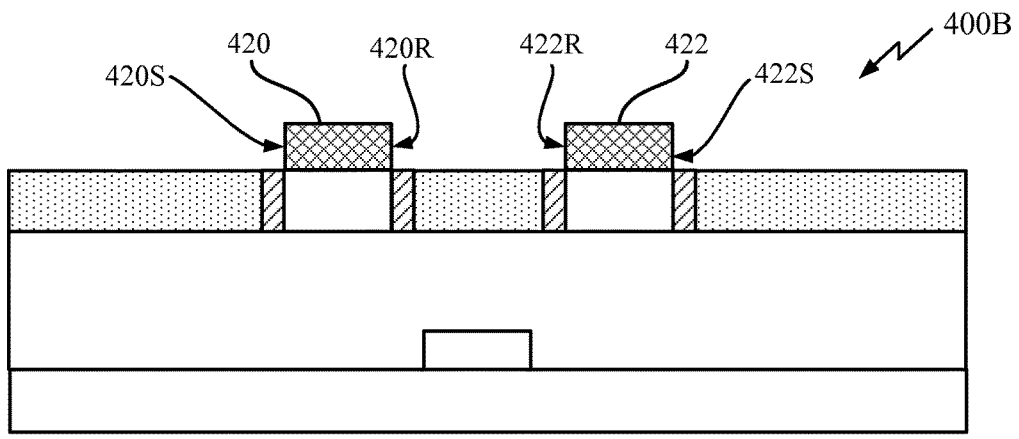

FIG. 4B shows in cross section one example next in-process structure 400B, formed by operations that may include, on the first metal member 408, electroless depositing a first sacrificial member 420 and, on the second metal member 412, electroless depositing a second sacrificial member 422.

In one example, the first sacrificial member 420 can include a first sacrificial member sidewall 420R and, as provided by the electroless plating, the first sacrificial member sidewall 420R can be aligned with the second metal member first sidewall 412A. In an aspect, the first sacrificial member sidewall 420R may be a first sacrificial member first sidewall 420R. In a related aspect, the first sacrificial member 420 can include a first sacrificial member second sidewall 420S. The first sacrificial member second sidewall 420S can, as provided by the electroless plating, be aligned with the first metal member second sidewall 408B. In an aspect, the second sacrificial member 422 may include a second sacrificial member first sidewall 422R that, again, as provided by the electroless plating, may be aligned with the second metal member first sidewall 412A. The second sacrificial member 422 may include a second sacrificial member second sidewall 422S and, in like manner, the second sacrificial member second sidewall 422S may be aligned with the second metal member second sidewall 412B.

In an aspect, subsequent operations, such as examples shown at FIGS. 4C and 4D that will be described in greater detail, can include forming an in-process first dielectric cap spacer, which may be configured to conform to the first sacrificial member first sidewall 420R. Similarly, such operations can include forming an in-process second dielectric cap spacer, which can be configured to conform to the second sacrificial member first sidewall 422R. The in-process first dielectric cap spacer and the in-process second dielectric cap spacer may comprise, for example, silicon nitride. In an aspect, the in-process first dielectric cap spacer can be among a pair of in-process dielectric cap spacers. Similarly, the in-process second dielectric cap spacer can be among another pair of in-process dielectric cap spacers Referring to FIG. 4C, in-process structure 400C shows a conformal layer 424 of a dielectric material deposited to cover the first sacrificial member 420, the second sacrificial member 422, and a surrounding top surface (visible in FIG. 4C but not separately labeled) of the fill dielectric 409. The conformal layer 424 may have a thickness "T", particularly on the sidewalls of the first sacrificial member 420 and the second sacrificial member 422.

Figure 4C:
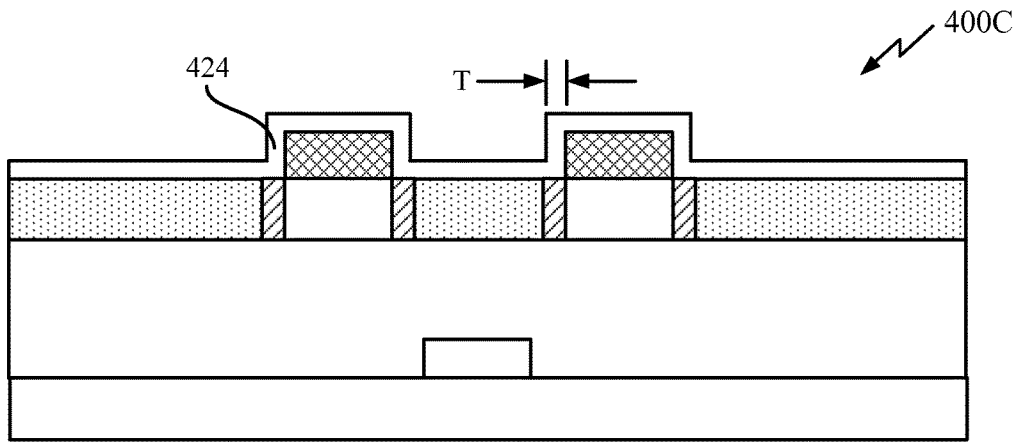
Figure 4D:
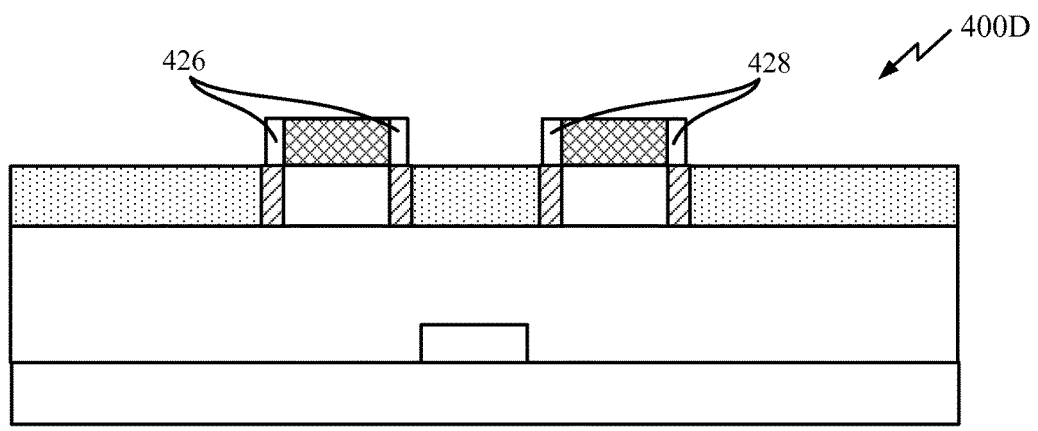

FIG. 4D shows, in cross section, one next in-process structure 400D, formed by anisotropically etching the conformal spacer deposited in FIG. 4C, to leave a pair of in-process first cap spacers 426 and a pair of in-process second cap spacers 428. As will be described in further detail, for example, in reference to FIG. 4I, upon later processing operations, the pair of in-process first cap spacers 426 may form a first nitride cap first dielectric spacer and a first nitride cap second dielectric spacer, and the pair of in-process second cap spacers 428 may form a second nitride cap first dielectric spacer and a second nitride cap second dielectric spacer.

Figure 4E:
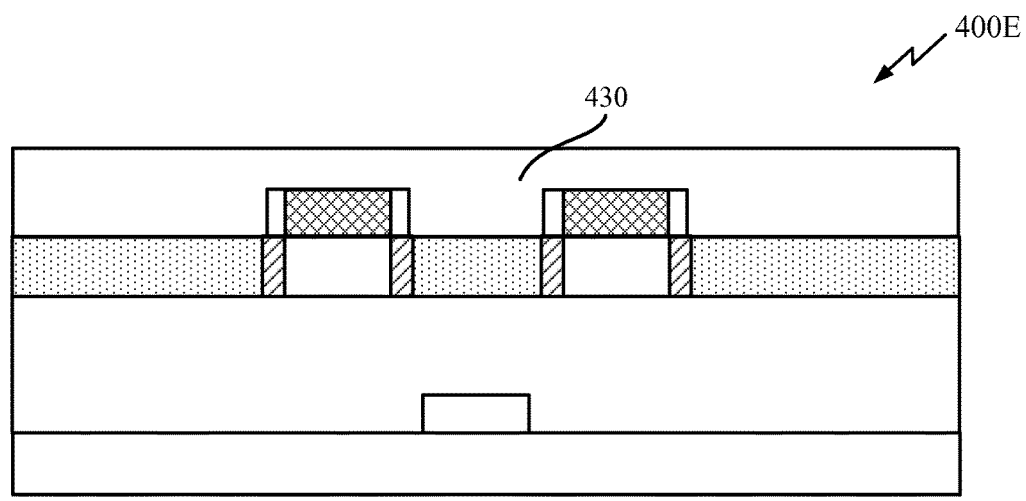

FIG. 4E shows, in cross section, one next in-process structure 400E, formed by depositing a dielectric layer 430 over an upper surface of the one example succeeding in-process structure shown at FIG. 4D.

Figure 4F:
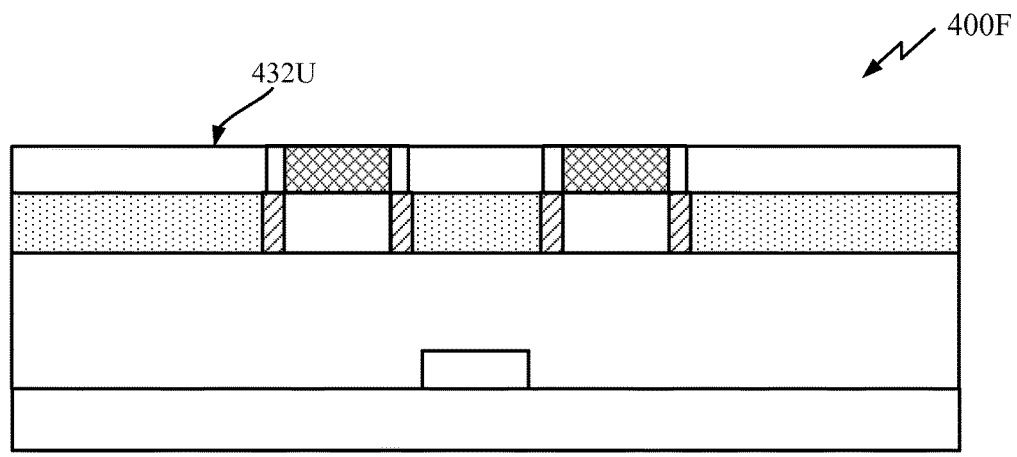

FIG. 4F shows, in cross section, one next in-process structure 400F, formed by applying a chemical mechanical processing on the next in-process structure 400E shown at FIG. 4E. The chemical mechanical processing can form an upper surface 432U.

Figure 4G:
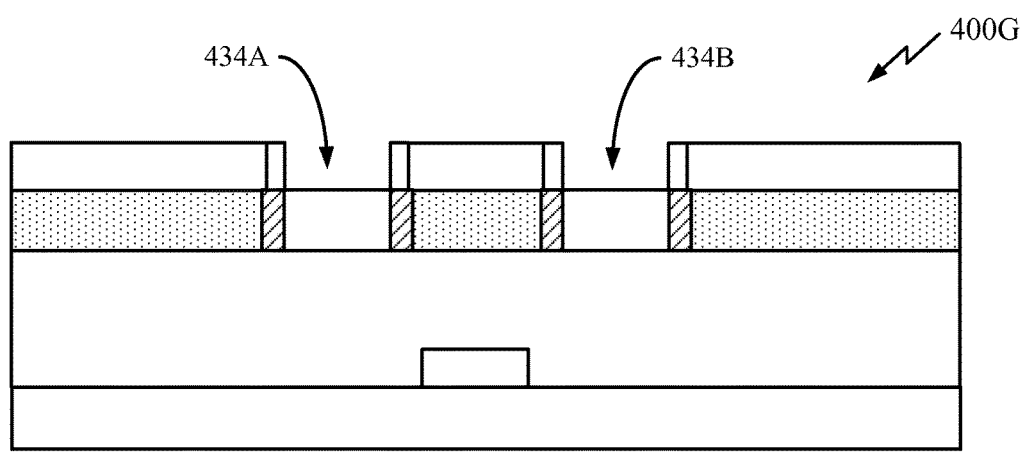

FIG. 4G shows, in cross section, one next in-process structure 400G, formed by selective etching of the sacrificial members shown remaining at FIG. 4F. The selective etching can leave, in place of the first sacrificial member 420, a first recess 434A and, in place of the second sacrificial member 422, a second recess 434B. The first recess 434A is defined in part by, and is aligned with the top surface of the first metal member 408. The second recess 434B is defined in part by, and is aligned with the top surface of the second metal member 412.

Figure 4H:
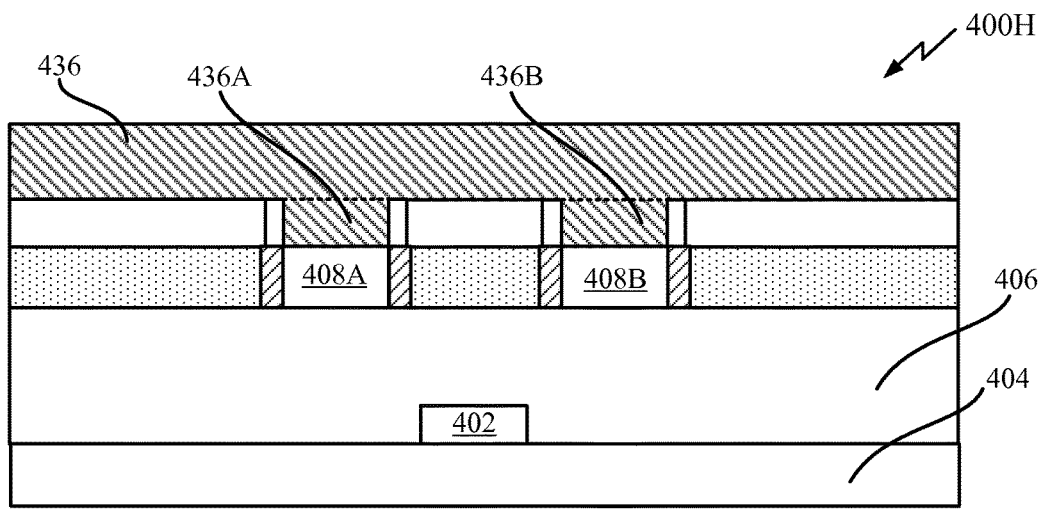

FIG. 4H shows in cross section one example succeeding in-process structure 400H, formed by a nitride deposition 436 that fills each of the first recess 434A and the second recess 434B shown formed at FIG. 4G. As will be further understood from FIG. 4I, region 436A of the nitride deposition 436 within the first recess 434A may be referred to as an in-process first nitride cap 436A. Similarly, region 436B of the nitride deposition 436 within the second recess 434B may be referred to as an in-process second nitride cap 436B. The in-process first nitride cap 436A has in-process cap sidewall (visible in FIG. 4H but not separately labeled) against one of the in-process first cap spacers 426, and has another in-process cap sidewall against another of the in-process first cap spacers 426. Each of these in-process cap sidewalls can be referred to as an in-process first cap sidewall. The in-process first nitride cap 436B has in-process cap sidewall (visible in FIG. 4H but not separately labeled) against one of the in-process second cap spacers 428, and another in-process cap sidewall against another of the in-process second cap spacers 428. Each of these in-process cap sidewalls can be referred to as an in-process second cap sidewall.

Figure 4I:
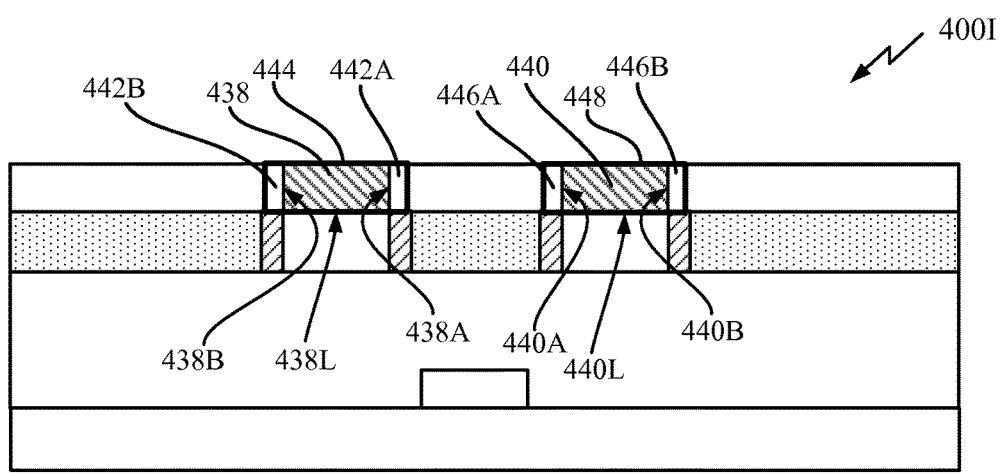

FIG. 4I show in cross section one example next in-process structure 400I, formed by applying a chemical mechanical processing on the conformal nitride deposition shown formed at FIG. 4H. Region 436A of the nitride deposition 436 within the first recess 434A that remains, i.e., the in-process first nitride cap in FIG. 4H, may be a first nitride cap 438. The first nitride cap 438 may have a first nitride cap lower surface 438L, a first nitride cap first sidewall 438A and a first nitride cap second sidewall 438B. Region 436B of the nitride deposition 436 within the second recess 434B that remains, i.e., the in-process second nitride cap in FIG. 4H, may be a second nitride cap 440. The second nitride cap 440 may have a second nitride cap lower surface 440L, a second nitride cap first sidewall 440A and a second nitride cap second sidewall 440B.

Referring to FIG. 4I, the pair of in-process first cap spacers 426 described in reference to FIG. 4D can provide a first nitride cap first dielectric spacer 442A and a first nitride cap second dielectric spacer 442B. The first nitride cap 438, first nitride cap first dielectric spacer 442A and first nitride cap second dielectric spacer 442B can, in combination, form a first protective cap 444. Similarly, the pair of in-process second cap spacers 428 described in reference to FIG. 4D can provide a second nitride cap first dielectric spacer 446A and a second nitride cap second dielectric spacer 446B. In addition, the second nitride cap 440, second nitride cap first dielectric spacer 446A and second nitride cap second dielectric spacer 446B can, in combination, form a second protective cap 448.

Continuing to refer to FIG. 4I, the first nitride cap first dielectric spacer 442A has a first nitride cap first dielectric spacer base (visible in FIG. 4I, but not separately labeled), which may be aligned to overlap, at least in part, a top (visible in FIG. 4I, but not separately labeled) of the first metal member first dielectric spacer 410A. The first nitride cap second dielectric spacer 442B has a first nitride cap second dielectric spacer base (visible in FIG. 4I, but not separately labeled), which may be aligned to overlap, at least in part, a top (visible in FIG. 4I, but not separately labeled) of the first metal member second dielectric spacer 410B. Similarly, the second nitride cap first dielectric spacer 446A has a second nitride cap first dielectric spacer base (visible in FIG. 4I, but not separately labeled), which may be aligned to at least partially overlap a top (visible in FIG. 4I, but not separately labeled) of the second metal member first dielectric spacer 414A. The second nitride cap second dielectric spacer 446B, in like manner, has a second nitride cap second dielectric spacer base (visible in FIG. 4I, but not separately labeled), which may be aligned to at least partially overlap a top (visible in FIG. 4I, but not separately labeled) of the second metal member second dielectric spacer 414B.

Subsequent operations can include self-aligning etching, using the first nitride cap, the upper level first dielectric cap spacer, the second nitride cap, and the upper level second dielectric cap spacer to form a via to the lower layer contact surface; and filling the via with a metal.

Figure 4J:
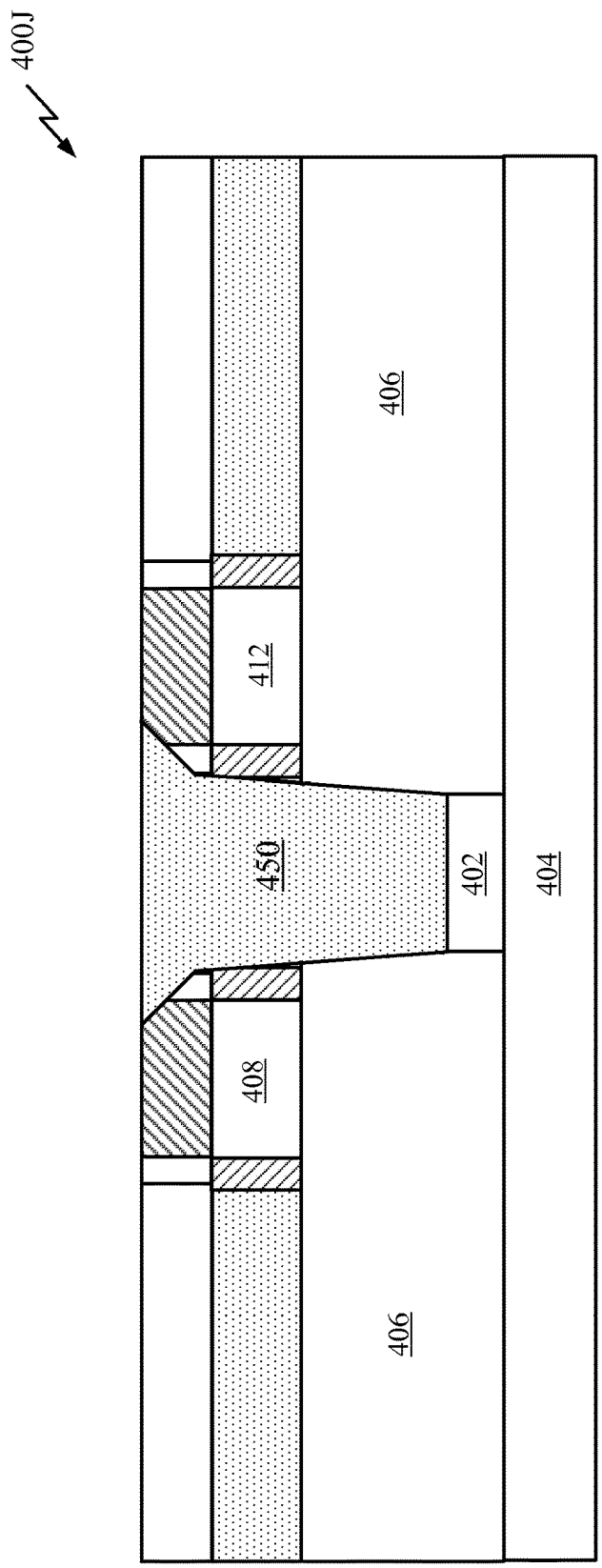

FIG. 4J shows a cross-sectional view of one example self-aligned source/drain contact 450, formed utilizing the selectively formed nitride caps in accordance with one or more aspects, as shown in FIGS. 4H-4I.

Figure 5:
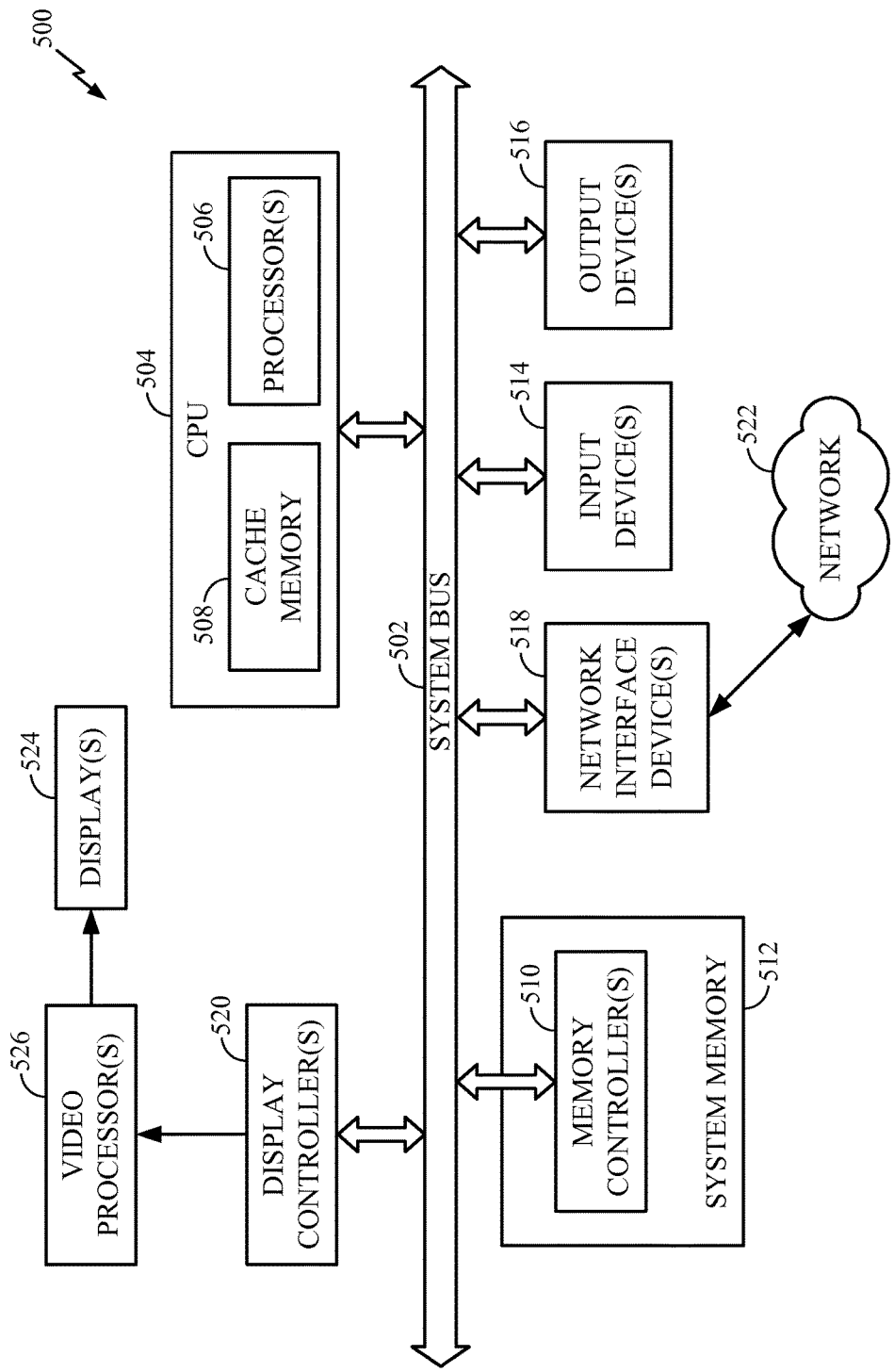
FIG. 5 shows a functional schematic of one example personal communication and computing device in accordance with one or more aspects.

FIG. 5 illustrates one example of a personal communication and computing device 500 that can be configured, as described herein, to utilize the selectively formed nitride caps described in reference to the FIGS. 2, 3A-3J and/or 4A-4J. Referring to FIG. 5, the personal communication and computing device 500 can include a system bus 502 and, coupled to the system bus 502, one or more CPUs 504. The CPUs 504 may comprise, for example, one or more processors or CPUs 506 and one or more cache memories 508. The CPU(s) 506 may be implemented by, for example, one or more programmable computing devices such as, without limitation, one or more ARM-type processing devices (not separately visible in FIG. 5). The CPUs 504 may, according to conventional communication protocols, communicate with these other devices by exchanging address, control, and data information over the system bus 502.

Referring to FIG. 5, the CPU(s) 504 may communicate bus transaction requests to a memory controller 510 of a memory system 512 as one example of a slave device.

Referring to FIG. 5, examples of other master and slave devices can include one or more input devices 514, one or more output devices 516, one or more network interface devices 518, and one or more display controllers 520. The input devices(s) 514, if employed, can include any type of input device, including but not limited to input keys, switches, voice processors, and the like. The output device (s) 516, if used, can include any type of output device, including but not limited to audio, video, other visual indicators and the like. The network interface device(s) 518, if used, can be any type of network interface device configured to allow exchange of data to and from a network 522. The network 522 can be any type of network, including but not limited to a wired or wireless network, a private or public network, a local area network (LAN), a wide area network (WLAN) and the Internet.

Continuing to refer to FIG. 5, the CPU(s) 504 may also be configured to access the display controller(s) 520 over the system bus 502 to control information sent to one or more displays 524. The display controller(s) 520 may send information to the display(s) 524 to be displayed, for example, via one or more video processors 526. Display(s) 524, if used, can include any type of display, for example, an active or passive liquid crystal display (LCD), a plasma display, and cathode ray tube (CRT).

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative aspects and example implementations of the same, it should be noted that various changes and modifications could be made herein without departing from the scope of the invention as defined by the appended claims. Functions, steps and/or actions in accordance with the method claims need not be performed in any particular order. Furthermore, although elements of the invention may be described or claimed in the singular, the plural is contemplated unless limitation to the singular is explicitly stated.

What is claimed is:

1. A self-aligned contact, extending from an upper level to a lower active region, aligned between a first metal member spacer on a sidewall of a first metal member and a second metal member spacer on a sidewall of a second metal member, comprising:
   a first protective cap comprising a first nitride cap and a first nitride cap spacer, wherein the first nitride cap is arranged above the first metal member and is configured with a first nitride cap sidewall aligned vertically with the sidewall of the first metal member, and the first nitride cap spacer is configured to conform to the first nitride cap sidewall;
   a second protective cap comprising a second nitride cap and a second nitride cap spacer, wherein the second nitride cap is arranged above the second metal member and is configured with a second nitride cap sidewall aligned vertically with the sidewall of the second metal member, and the second nitride cap spacer is configured to conform to the second nitride cap sidewall; and
   a metal contact, configured to fill a recess defined, at least in part, by an upper surface of the lower active region, a surface of the first metal member spacer, a surface of the second metal member spacer, a surface of the first nitride cap spacer, and a surface of the second nitride cap spacer
      such that the metal contact is in direct contact with each of the upper surface of the lower active region, a surface of the first metal member spacer, the surface of the second metal member spacer, the surface of the first nitride cap spacer, and the surface of the second nitride cap spacer, and
      such that a portion of the metal contact at the upper level is wider than a portion of the metal contact at the lower active region,
   wherein a material of the first metal member spacer in direct contact with the sidewall of the first metal member is different from a material of the first nitride cap spacer in direct contact with the first nitride cap sidewall, or
   wherein a material of the second metal member spacer in direct contact with the sidewall of the second metal member is different from a material of the second nitride cap spacer in direct contact with the second nitride cap sidewall, or
   both.

2. The self-aligned contact of claim 1,
   wherein the lower active region is an active source/drain region of a FinFET fin, the first metal member spacer is a first dielectric spacer, the first metal member is a first gate metal, the second metal member spacer is a second dielectric spacer, and the second metal member is a second gate metal,
   wherein the first nitride cap spacer is a first cap dielectric spacer, and
   wherein the second nitride cap spacer is a second cap dielectric spacer.

3. The self-aligned contact of claim 2, wherein the first gate metal and the second gate metal comprise tungsten.

4. The self-aligned contact of claim 2, wherein the first cap dielectric spacer and the second cap dielectric spacer each comprises silicon dioxide.

5. The self-aligned contact of claim 1, wherein the first nitride cap and the second nitride cap each comprises silicon nitride.

6. The self-aligned contact of claim 2, wherein the first cap dielectric spacer and the second cap dielectric spacer each comprises silicon nitride.

7. The self-aligned contact of claim 1,
wherein the lower active region is a lower level contact,
wherein the first nitride cap spacer is a first nitride cap dielectric spacer, the first nitride cap is supported on an upper surface of the first metal member, and the first nitride cap dielectric spacer is configured to conform to the first nitride cap sidewall, and
wherein the second nitride cap spacer is a second nitride cap dielectric spacer, the second nitride cap dielectric spacer is configured to conform to the second nitride cap sidewall, and the second nitride cap is supported on an upper surface of the second metal member.

8. The self-aligned contact of claim 7,
wherein the first metal member spacer is a first metal member first dielectric spacer, and the sidewall of the first metal member is a first metal member first sidewall,
wherein the second metal member spacer is a second metal member first dielectric spacer, and the sidewall of the second metal member is a second metal member first sidewall,
wherein the first metal member is further configured to have a first metal member second sidewall, and the second metal member is further configured to have a second metal member second sidewall, and
wherein the self-aligned contact further comprises:
a first metal member second dielectric spacer configured to conform to the first metal member second sidewall; and
a second metal member second dielectric spacer configured to conform to the second metal member second sidewall.

9. The self-aligned contact of claim 8,
wherein the first nitride cap sidewall is a first nitride cap first sidewall and the first nitride cap dielectric spacer is a first nitride cap first dielectric spacer, the second nitride cap sidewall is a second nitride cap first sidewall, and the second nitride cap dielectric spacer is a second nitride cap first dielectric spacer,
wherein the first nitride cap also forms a first nitride cap second sidewall aligned with the first metal member second sidewall,
wherein the second nitride cap also forms a second nitride cap second sidewall aligned with the second metal member second sidewall,
wherein the first protective cap further comprises a first nitride cap second dielectric spacer configured to conform to the first nitride cap second sidewall and is above the first metal member second dielectric spacer, and
wherein the second protective cap further comprises a second nitride cap second dielectric spacer configured to conform to the second nitride cap second sidewall and is above the second metal member second dielectric spacer.

10. The self-aligned contact of claim 9,
wherein the first nitride cap has a first nitride cap lower surface configured to contact the upper surface of the first metal member, and
wherein the second nitride cap has a second nitride cap lower surface configured to contact the upper surface of the second metal member.

11. The self-aligned contact of claim 10,
wherein the first metal member first dielectric spacer is configured to form a first metal member first dielectric spacer top and the first metal member second dielectric spacer is configured to form a first metal member second dielectric spacer top, and
wherein the second metal member first dielectric spacer is configured to form a second metal member first dielectric spacer top and the second metal member second dielectric spacer is configured to form a second metal member second dielectric spacer top.

12. The self-aligned contact of claim 11,
wherein the first metal member is a first gate metal, the first metal member first dielectric spacer and the first metal member second dielectric spacer are configured to form a pair of first gate spacers, the first gate metal is configured to form a pair of first gate metal sidewalls, and the pair of first gate metal sidewalls are configured to conform, respectively, to the pair of first gate spacers, and
wherein the second metal member is a second gate metal, the second metal member first dielectric spacer and the second metal member second dielectric spacer are configured to form a pair of second gate spacers, the second gate metal is configured to form a pair of second gate metal sidewalls, and the pair of second gate metal sidewalls are configured to conform, respectively, to the pair of second gate spacers.

13. The self-aligned contact of claim 12,
wherein the first nitride cap first dielectric spacer is configured with a first nitride cap first dielectric spacer base arranged to at least partially overlap the first metal member first dielectric spacer top,
wherein the first nitride cap second dielectric spacer is configured with a first nitride cap second dielectric spacer base arranged to at least partially overlap the first metal member second dielectric spacer top,
wherein the second nitride cap first dielectric spacer is configured with a second nitride cap first dielectric spacer base arranged to at least partially overlap the second metal member first dielectric spacer top, and
wherein the second nitride cap second dielectric spacer is configured with a second nitride cap second dielectric spacer base arranged to at least partially overlap the second metal member second dielectric spacer top.

14. The self-aligned contact of claim 13, wherein the first nitride cap first dielectric spacer, the first nitride cap second dielectric spacer, the second nitride cap first dielectric spacer, and the second nitride cap second dielectric spacer are $Si_xO_y$ or $SiO_2$, or both.

15. The self-aligned contact of claim 1,
wherein widths of the first metal member and the first nitride cap are substantially equal, or
wherein widths of the second metal member and the second nitride cap are substantially equal, or
both.

16. The self-aligned contact of claim 1,
wherein the first metal member has a T-shaped cross-section, or
wherein the second metal member has the T-shaped cross-section, or
both.

17. The self-aligned contact of claim 16,
wherein the first metal member comprises a first metal member base and a first metal member upper region, and the first metal member upper region is in direct contact with the first metal member spacer, or
wherein the second metal member comprises a second metal member base and a second metal member upper region, and the second metal member upper region is in direct contact with the second metal member spacer, or both.

18. The self-aligned contact of claim 1,
wherein an upper surface of the first metal member and an upper surface of the first metal member spacer form a first common plane, or
wherein an upper surface of the second metal member and an upper surface of the second metal member spacer form a second common plane, or
both.

19. The self-aligned contact of claim 17, further comprising:
another first metal member spacer in direct contact with an opposite sidewall of the first metal member;
another second metal member spacer in direct contact with an opposite sidewall of the second metal member; and
at least one first other gate layer or at least one second other gate layer or both,
wherein the at least one first other gate layer is below the first metal member upper region, is in between inner walls of the first metal member spacer and the another first metal member spacer, and has a U-shaped cross-section so as to surround both side walls and a lower wall of the first metal member base, and
wherein the at least one second other gate layer is below the second metal member upper region, is in between inner walls of the second metal member spacer and the another second metal member spacer, and has a U-shaped cross-section so as to surround both side walls and a lower wall of the second metal member base.

20. The self-aligned contact of claim 1, further comprising:
another first metal member spacer in direct contact with an opposite sidewall of the first metal member; and
another second metal member spacer in direct contact with an opposite sidewall of the second metal member,
wherein an upper surface of the first metal member, an upper surface of the first metal member spacer, and an upper surface of the another first metal member spacer form a first common plane, or
wherein an upper surface of the second metal member, an upper surface of the second metal member spacer, and an upper surface of the another second metal member spacer form a second common plane, or
both.

21. The self-aligned contact of claim 1,
wherein a sidewall of the first nitride cap spacer conforming to the first nitride cap sidewall is aligned vertically with a sidewall of the first metal member spacer that is on the sidewall of the first metal member, or
wherein a sidewall of the second nitride cap spacer conforming to the second nitride cap sidewall is aligned vertically with a sidewall of the second metal member spacer that is on the sidewall of the second metal member, or
both.

* * * * *